(12) United States Patent
Tsukuda

(10) Patent No.: US 8,446,139 B2
(45) Date of Patent: May 21, 2013

(54) CURRENT SOURCE, ELECTRONIC APPARATUS, AND INTEGRATED CIRCUIT

(75) Inventor: Yasunori Tsukuda, Kanagawa (JP)

(73) Assignee: Sony Corporation, Tokyo (JP)

( * ) Notice: Subject to any disclaimer, the term of this patent is extended or adjusted under 35 U.S.C. 154(b) by 346 days.

(21) Appl. No.: 12/923,326

(22) Filed: Sep. 15, 2010

(65) Prior Publication Data

US 2011/0080145 A1 Apr. 7, 2011

(30) Foreign Application Priority Data

Oct. 2, 2009 (JP) ................................. 2009-230295

(51) Int. Cl.
*G05F 1/40* (2006.01)

(52) U.S. Cl.
USPC .............................. 323/312; 327/102; 327/157

(58) Field of Classification Search
USPC .................................... 323/312; 327/157, 102
See application file for complete search history.

(56) References Cited

U.S. PATENT DOCUMENTS

| 6,853,256 | B2 * | 2/2005 | Takenaka et al. | ................ 331/17 |
| 7,057,465 | B2 * | 6/2006 | Wakayama | ..................... 331/16 |
| 2008/0074200 | A1 * | 3/2008 | Cong | .............................. 331/16 |

FOREIGN PATENT DOCUMENTS

JP 04-215317 A 8/1992

* cited by examiner

*Primary Examiner* — Harry Behm
(74) *Attorney, Agent, or Firm* — Rader, Fishman & Grauer PLLC

(57) ABSTRACT

Disclosed herein is a current source, including: a current control oscillator configured to output an oscillation signal of a frequency dependent on an input current; a comparator configured to compare the oscillation signal with a reference signal; a charge pump configured to output a current dependent on a comparison result by the comparator; a low-pass filter configured to include a smoothing capacitor charged and discharged by an output current of the charge pump; a loop converter configured to be connected to the smoothing capacitor and generate a current dependent on a voltage generated by the smoothing capacitor to supply the current as the input current to the current control oscillator; and an output converter configured to be connected to the low-pass filter and generate a current dependent on a voltage generated in the low-pass filter to output the current as an output current.

17 Claims, 11 Drawing Sheets

CURRENT SOURCE, ELECTRONIC APPARATUS, AND INTEGRATED CIRCUIT

BACKGROUND OF THE INVENTION

1. Field of the Invention

The present invention relates to a current source, electronic apparatus, and an integrated circuit each employing a PLL (phase-locked loop) circuit.

2. Description of the Related Art

Japanese Patent Laid-open No. Hei 4-215317 (hereinafter, Patent Document 1) discloses a phase-locked loop circuit.

In the PLL circuit as the phase-locked loop circuit of Patent Document 1, a pair of voltages is generated by a voltage-current converter in a voltage control oscillator in the control loop, and this pair of voltages is input to transistors for the constant current source in a charge pump.

This eliminates the need for the phase-locked loop circuit of Patent Document 1 to have an external power supply for allowing the constant current operation of the transistors for the constant current source in the charge pump.

SUMMARY OF THE INVENTION

The phase-locked loop circuit of Patent Document 1 generates the current used by the charge pump by the voltage-current converter and the transistors for the constant current source in the charge pump.

Thus, there is a possibility that the phase-locked loop circuit of Patent Document 1 can be used as a current source.

However, in Patent Document 1, the pair of voltages is generated by making the voltage-current converter included in the control loop of the PLL circuit have a special configuration to generate the pair of voltages.

Specifically, in Patent Document 1, an operational amplifier is used as the input part of the voltage-current converter in order to generate the pair of voltages utilized by the charge pump.

Furthermore, in Patent Document 1, a transistor and a resistance element are connected to the output of the operational amplifier, and the voltage across the resistance element is fed back to the operational amplifier.

Therefore, for the operation of the voltage-current converter in Patent Document 1, at least the voltage equal to the sum of the voltage drop across the transistors of two stages and the voltage across the resistance element for feedback is necessary as the supply voltage.

Thus, if the phase-locked loop circuit of Patent Document 1 is used as a current source, this current source cannot be driven by a low voltage comparable to the voltage drop across the transistors of two stages.

The following other problems also exist if the phase-locked loop circuit of Patent Document 1 is used as a current source.

The voltage-current converter in Patent Document 1 carries out voltage-current conversion by using the operational amplifier, the resistance element, and so forth. Therefore, if the phase-locked loop circuit of Patent Document 1 is used as a current source, the mounting area of the current source is large.

Furthermore, the voltage generated by the voltage-current converter in Patent Document 1 varies directly due to output variation of the charge pump. As a result, the current generated by the transistor for the constant current source also varies directly due to the output variation of the charge pump.

The charge pump in the control loop of the PLL circuit charges/discharges a smoothing capacitor discretely in the time dependent on the phase difference between two signals locked with each other by the phase-locked loop circuit.

For example, the charge pump charges/discharges the smoothing capacitor in each period during which a phase difference between two signals exists.

Therefore, the output of the charge pump discretely charges/discharges the smoothing capacitor even when a slight phase difference exists between two signals locked with each other by the phase-locked loop circuit.

Consequently, if the phase-locked loop circuit of Patent Document 1 is used as a current source, the output current varies due to a ripple component even in a stable state in which a phase difference scarcely exists between two signals.

This variation of the output current affects the operation of the circuit that operates by this output current.

Furthermore, this variation of the output current is a constraint condition in the design of the circuit connected to the current source.

This variation of the output current can be suppressed by connecting a capacitor having high capacitance to the output of the voltage-current converter. However, using the capacitor having high capacitance further increases the mounting area of the current source.

This variation of the output current can be suppressed also by limiting the band of the operational amplifier. However, the band of the operational amplifier needs to have no influence on the loop characteristics of the PLL. Therefore, it is difficult to limit the band of the operational amplifier to such a great extent that the desired stability is obtained in the output current.

As just described, the current source is required to supply a stable constant current in low-voltage driving.

According to a first embodiment of the present invention, there is provided a current source including a current control oscillator configured to output an oscillation signal of a frequency dependent on an input current and a comparator configured to compare the oscillation signal with a reference signal. The current source further includes a charge pump configured to output a current dependent on a comparison result by the comparator and a low-pass filter configured to include a smoothing capacitor charged and discharged by an output current of the charge pump. The current source further includes a loop converter configured to be connected to the smoothing capacitor and generate a current dependent on a voltage generated by the smoothing capacitor to supply the current as the input current to the current control oscillator and an output converter configured to be connected to the low-pass filter and generate a current dependent on a voltage generated in the low-pass filter to output the current as an output current.

In the first embodiment, a control loop functioning as a PLL circuit is configured by the current control oscillator, the comparator, the charge pump, the smoothing capacitor, and the loop converter. The current control oscillator oscillates a signal whose phase or frequency is locked with that of the reference signal input to the comparator.

If the signal oscillated by the current control oscillator is stable, the voltage generated by e.g. the smoothing capacitor of the low-pass filter is also stable.

The output converter generates a stable current from this stable voltage generated by the low-pass filter.

Thereby, the current source of the first embodiment can supply a stable constant current in low-voltage driving.

According to a second embodiment of the present invention, there is provided an electronic apparatus including a current source that outputs a current and an input-subject unit to which an output current of the current source is input. The current source includes a current control oscillator configured to output an oscillation signal of a frequency dependent on an input current and a comparator configured to compare the oscillation signal with a reference signal. The current source further includes a charge pump configured to output a current dependent on a comparison result by the comparator and a low-pass filter configured to include a smoothing capacitor charged and discharged by an output current of the charge pump. The current source further includes a loop converter configured to be connected to the low-pass filter and generate a current dependent on a voltage output by the low-pass filter to supply the current as the input current to the current control oscillator and an output converter configured to be connected to the low-pass filter and generate a current dependent on a voltage generated in the low-pass filter to output the current as an output current.

According to a third embodiment of the present invention, there is provided an integrated circuit including a current source. The current source includes a current control oscillator configured to output an oscillation signal of a frequency dependent on an input current and a comparator configured to compare the oscillation signal with a reference signal. The current source further includes a charge pump configured to output a current dependent on a comparison result by the comparator and a low-pass filter configured to include a smoothing capacitor charged and discharged by an output current of the charge pump. The current source further includes a loop converter configured to be connected to the low-pass filter and generate a current dependent on a voltage output by the low-pass filter to supply the current as the input current to the current control oscillator and an output converter configured to be connected to the low-pass filter and generate a current dependent on a voltage generated in the low-pass filter to output the current as an output current.

The embodiments of the present invention allow supply of a stable constant current in low-voltage driving.

DETAILED DESCRIPTION OF THE PREFERRED EMBODIMENTS

Embodiments of the present invention will be described below in association with the drawings. The order of the description is as follows.

1. First Embodiment (example of a constant current source in which an output converter is connected to the connecting node between a capacitor and a resistance element)

2. Second Embodiment (example of a constant current source in which the output current is switched by switches)

3. Third Embodiment (example of a constant current source having an internal-use converter)

4. Fourth Embodiment (example of a constant current source in which an internal-use converter has a current supply unit for activation timing and outputs a current as the sum of currents based on the currents of the current supply unit and a voltage-current conversion circuit)

5. Fifth Embodiment (example of a constant current source that adds a current for activation timing to the current of an output converter and outputs the resulting current)

6. Sixth Embodiment (example of electronic apparatus)

7. Comparative Example 1 (one example of a current source based on a current mirror circuit)

8. Comparative Example 2 (one example of a current source having a constant voltage generator and a voltage-current converter)<

1. First Embodiment

Configuration of Constant Current Source 1

Figure 1:
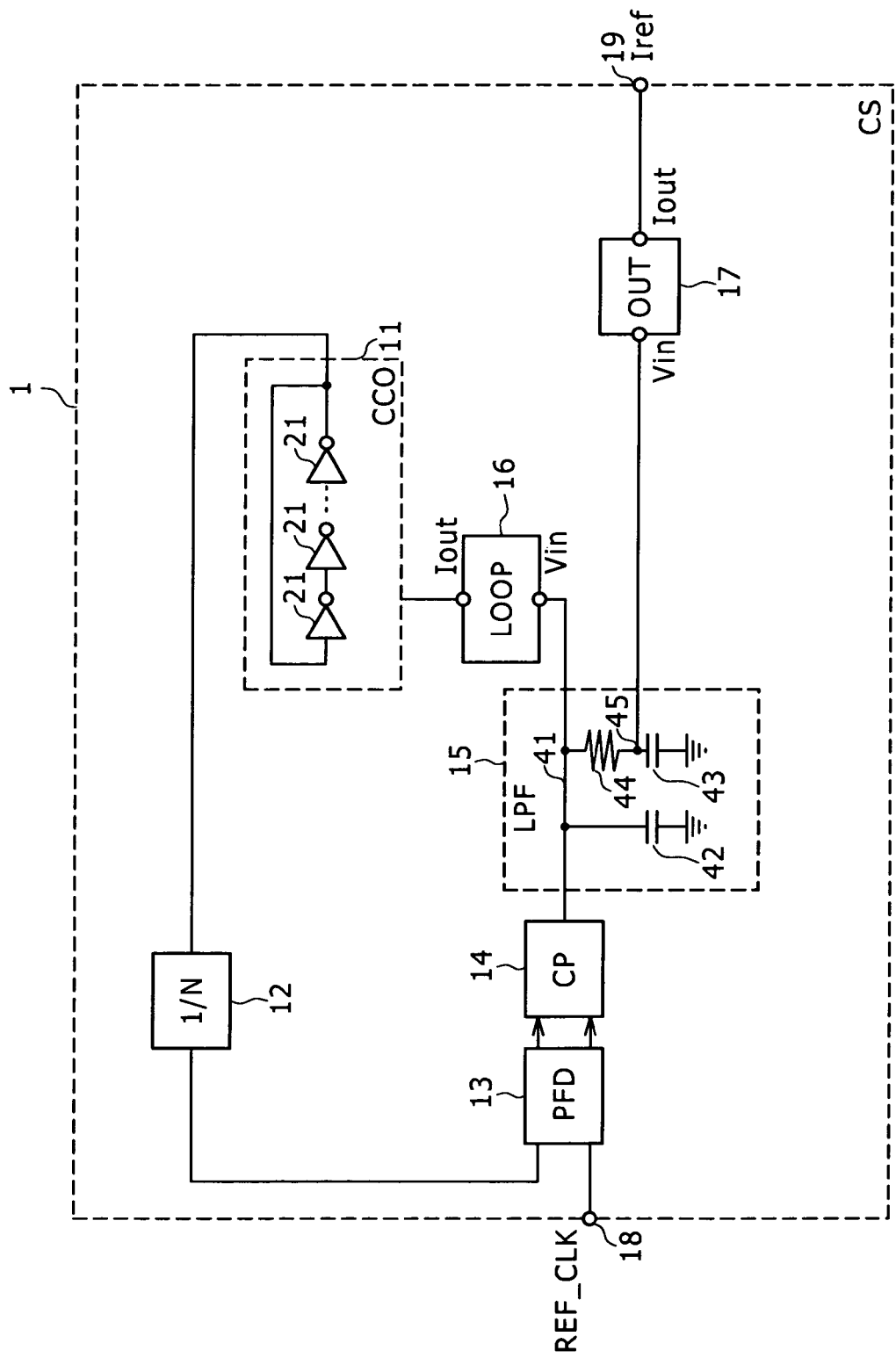
FIG. 1 is a block diagram of a constant current source according to a first embodiment of the present invention.

FIG. 1 is a block diagram of a constant current source (CS) 1 according to a first embodiment of the present invention.

The constant current source 1 of FIG. 1 has a current control oscillator (CCO) 11, a frequency divider (1/N) 12, a comparator (PFD) 13, a charge pump (CP) 14, a low-pass filter (LPF) 15, a loop converter (LOOP) 16, and an output converter (OUT) 17.

The constant current source 1 of FIG. 1 is so used as to be integrated into an integrated circuit.

The current control oscillator 11 has an odd number of plural inverters 21.

The plural inverters 21 are connected in series. The output of the inverter 21 of the final stage of the serial connection is input to the inverter 21 of the first stage.

A signal is circulated by the closed loop of these plural inverters 21. Thereby, the current control oscillator 11 generates an oscillation signal.

The loop converter 16 is connected to the plural inverters 21 of the current control oscillator 11 and a signal line 41 of the low-pass filter 15 to be described later.

The loop converter 16 outputs a drive current dependent on the input voltage of the loop converter 16 to the respective inverters 21.

When the input voltage from the low-pass filter 15 is higher for example, the loop converter 16 outputs a larger drive current.

Figure 2:
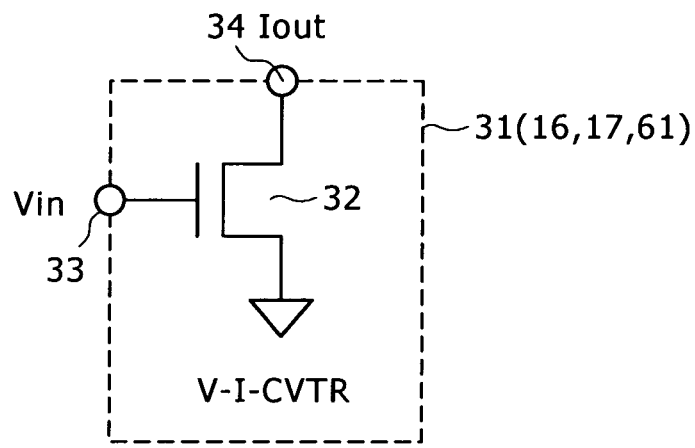
FIG. 2 is a block diagram of a voltage-current conversion circuit that can be used as an output converter in FIG. 1.

FIG. 2 is a block diagram of a voltage-current conversion circuit 31 that can be used as the output converter 17 in FIG. 1.

The voltage-current conversion circuit 31 has one N-ch transistor 32, an input node 33, and an output node 34.

The gate electrode (control electrode) of the N-ch transistor 32 is connected to the input node 33. The source electrode (first electrode) is connected to the ground of the integrated circuit. The drain electrode (second electrode) is connected to the output node 34.

The N-ch transistor 32 in the voltage-current conversion circuit 31 forms an N-channel between the source electrode and the drain electrode by a voltage Vin input to the input node.

Thereby, the current dependent on the voltage input to the input node flows from the drain electrode to the source electrode.

This current is an output current Iout.

If the voltage-current conversion circuit 31 of FIG. 2 is used as the loop converter 16, the input node 33 in FIG. 2 is connected to the signal line 41 of the low-pass filter 15 to be described later. The output node 34 is connected to the plural inverters 21 of the current control oscillator 11.

The loop converter 16 by the voltage-current conversion circuit 31 of FIG. 2 draws a current from the output node 34. The signal delay time of each inverter 21 of the current control oscillator 11 is the time dependent on this drawn current.

Thus, the loop converter 16 outputs an oscillation signal of a frequency dependent on the input voltage of the loop converter 16.

The frequency divider 12 is connected to the current control oscillator 11.

The frequency divider 12 carries out frequency division of the oscillation signal input from the current control oscillator 11 into 1/N (N is a natural number).

The comparator 13 is connected to the frequency divider 12 and a clock input terminal 18. To the clock input terminal 18, a reference clock signal is input.

The comparator 13 compares the oscillation signal resulting from the frequency division with the reference clock signal, and outputs a signal dependent on the phase difference and the frequency difference between these signals.

The clock input terminal 18 is connected to e.g. an external clock input terminal of the integrated circuit.

The charge pump 14 is connected to the comparator 13.

The charge pump 14 outputs a current dependent on the signal input from the comparator 13.

For example, when the phase of the oscillation signal resulting from the frequency division is advanced relative to the reference clock signal, the charge pump 14 draws the current dependent on the amount of advance in the advance period based on the signal input from the comparator 13.

When the phase of the oscillation signal resulting from the frequency division is delayed relative to the reference clock signal, the charge pump 14 supplies the current dependent on the amount of delay in the delay period based on the signal input from the comparator 13.

The low-pass filter 15 has the signal line 41, a smoothing capacitor 42, a second capacitor 43, and a resistance element 44.

One end of the smoothing capacitor 42 is connected to the output of the charge pump 14 by the signal line 41. The other end of the smoothing capacitor 42 is connected to the ground.

One end of the resistance element 44 is connected to the output of the charge pump 14 by the signal line 41. The other end of the resistance element 44 is connected to one end of the second capacitor 43. The other end of the second capacitor 43 is connected to the ground.

Thereby, the circuit of the series connection of the second capacitor 43 and the resistance element 44 is connected in parallel to the smoothing capacitor 42.

Hereinafter, the node to which the resistance element 44 and the second capacitor 43 are connected will be referred to as the connecting node 45.

The output converter 17 is connected to the connecting node 45 of the low-pass filter 15 and an output terminal 19 of the constant current source 1.

The output converter 17 can be formed by e.g. the voltage-current conversion circuit 31 of FIG. 2.

In this case, the N-ch transistor 32 in FIG. 2 functions as an output transistor. The input node 33 in FIG. 2 is connected to the connecting node 45 of the low-pass filter 15. The output node 34 is connected to the output terminal 19 of the constant current source 1.

When the voltage input from the connecting node 45 to the output converter 17 is higher, the output converter 17 by the voltage-current conversion circuit 31 of FIG. 2 draws a larger current from the output terminal 19.

[Operation of Constant Current Source 1]

Upon supply of power to the integrated circuit into which the constant current source 1 of FIG. 1 is integrated, the current control oscillator 11 generates the oscillation signal circulated in the closed loop by the plural stages of the inverters 21 connected in series. This oscillation signal is subjected to frequency division by the frequency divider 12 and input to the comparator 13.

Upon input of the reference signal to the clock input terminal 18, the comparator 13 outputs a signal dependent on the phase difference and the frequency difference between the oscillation signal resulting from the frequency division and the reference clock signal.

The charge pump 14 outputs a current that reduces the phase difference or the frequency difference.

By this current, the smoothing capacitor 42 and the second capacitor 43 of the low-pass filter 15 are charged or discharged.

The voltage level of the signal line 41 of the low-pass filter 15 changes to a voltage level that suppresses the phase difference and the frequency difference between the oscillation signal resulting from the frequency division and the reference signal.

The loop converter 16 supplies a drive current dependent on the voltage level of the signal line 41 of the low-pass filter 15 to the plural inverters 21 of the current control oscillator 11.

By the above-described control, the voltage level of the signal line 41 of the low-pass filter 15 is so controlled that the phase difference and the frequency difference between the oscillation signal resulting from the frequency division and the reference signal are reduced.

If the voltage level of the signal line 41 becomes the desired voltage level, the phase difference and the frequency difference between the oscillation signal resulting from the frequency division and the reference signal become substantially zero.

In this state, the operating state of the control loop is stabilized.

The output converter 17 outputs an output current dependent on the voltage of the connecting node 45 of the low-pass filter 15 to the output terminal 19 of the constant current, source 1.

If the operating state of the control loop is stable, the voltage of the second capacitor 43 of the low-pass filter 15 is also stable.

Thus, the current output by the output converter 17 is also stable.

As described above, the constant current source 1 of the first embodiment has a PLL circuit (phase-locked loop circuit) by the current control oscillator 11, the frequency divider 12, the comparator 13, the charge pump 14, the low-pass filter 15, and the loop converter 16.

The constant current source 1 functions as the PLL circuit even if the frequency divider 12 is absent.

The constant current source 1 of the first embodiment generates a constant current by favorably using the control loop of the PLL circuit (phase-locked loop circuit) structure.

Thus, the constant current source 1 of the first embodiment allows low-voltage driving.

Furthermore, the constant current source 1 of the first embodiment can supply a stable constant current that is robust against so-called PVT (Process, Voltage, Thermo) variations such as manufacturing variation, supply voltage variation, and temperature variation.

Figure 3:
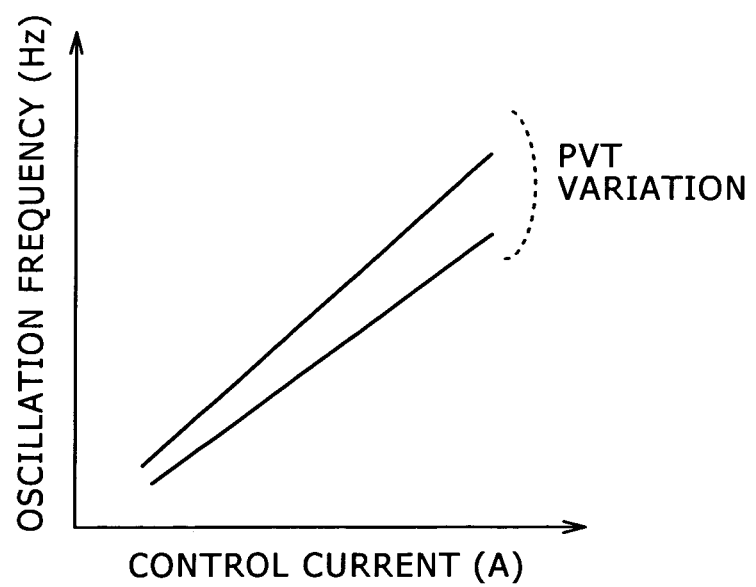
FIG. 3 is a characteristic diagram showing the relationship between the drive current and the oscillation frequency in a current control oscillator in FIG. 1.

FIG. 3 is a characteristic diagram showing the relationship between the drive current and the oscillation frequency in the current control oscillator 11.

In the state in which the frequency and phase of the oscillation signal are locked in the control loop of the PLL circuit, the drive current dependent on the locked frequency flows to the current control oscillator 11. In general, this current value is so designed as to lower the sensitivity to the supply voltage variation.

The sensitivity to the manufacturing variation depends mainly on the load of the oscillation stage in the current control oscillator 11. The load of the oscillation stage is determined by the thickness of the gate oxide film of the transistor included in the inverter 21. The gate oxide film can be manufactured with high accuracy of the thickness thereof.

As a result, the sensitivity of the control current to the manufacturing variation is low. For a similar reason, the sensitivity to the temperature variation is also low.

In the first embodiment, as the output converter 17, the voltage-current conversion circuit 31 having the same structure (replica structure) as that of the loop converter 16, which supplies a current to the current control oscillator 11, is used.

Therefore, in the first embodiment, a constant current with high accuracy can be supplied in low-voltage driving, which is difficult to realize with a current source of the related-art technique.

In the first embodiment, the output converter 17 is connected not to the signal line 41 of the low-pass filter 15 but to the connecting node 45 of the low-pass filter 15.

This connecting node 45 is at the potential having frequency information.

On the other hand, for the signal line 41, the output of the charge pump 14 draws a charge or injects a charge transiently in frequency acquisition and in normal operation.

Thus, the voltage of the signal line 41 includes a ripple component of the voltage due to the control by the control loop, and transient potential variation occurs.

On the other hand, for the voltage of the connecting node 45, the voltage variation of the signal line 41 is smoothed by a low-pass filter configured by the resistance element 44 (R1) and the capacitance (C1) of the second capacitor 43.

Therefore, by inputting the voltage of the connecting node 45 to the output converter 17, a transient current change of the output current of the constant current source 1 can be avoided, and erroneous operation in an input-subject unit utilizing this output current can be prevented.

That is, the constant current source 1 of the first embodiment has a circuit configuration for inputting the potential having the frequency information in the low-pass filter 15 in the PLL circuit to the output converter 17 as a replica of the loop converter 16 and outputting the obtained current as the output current.

Thus, the constant current source 1 of the first embodiment has the following advantageous effects.

Using the constant current source 1 of the first embodiment can realize the constant current source 1 that outputs a high-accuracy current even by a low supply voltage, which is difficult to realize with a constant current source of the related art.

In analog circuits such as the constant current source of the related art, the limit to the necessary minimum supply voltage is more severe compared with e.g. a PLL circuit. However, the above-described advantage allows driving with a voltage lower than this limit.

Furthermore, in the case of the constant current source 1 of the first embodiment, a large part of the circuit necessary to realize the constant current source 1 can be realized by utilizing an existing PLL Thus, if a constant current is used in e.g. the charge pump 14 in the PLL circuit, the number of additional circuits to realize the constant current source 1 can be suppressed, and a very-small area can be set as the mounting area of the constant current source 1.

Furthermore, the constant current source 1 of the first embodiment has such a structure that the influence of sudden current change and transient response in the constant current source 1 is less readily seen from the respective input-subject circuits connected to the constant current source 1.

Therefore, the design of the input-subject circuit is easy.

The constant current source 1 of the first embodiment is free from the need to separately use a low-pass filter, an amplifier, etc. to attenuate transient response.

As a result, the constant current source 1 of the first embodiment can output a stable constant current with a small area and saved power.

As just described, the constant current source 1 of the first embodiment allows easy realization of a high-accuracy current source with a small area and saved power.

In addition, in an integrated circuit employing the PLL circuit, the constant current source 1 can be realized by utilizing this PLL circuit.

2. Second Embodiment

Configuration of Constant Current Source 1

Figure 4:
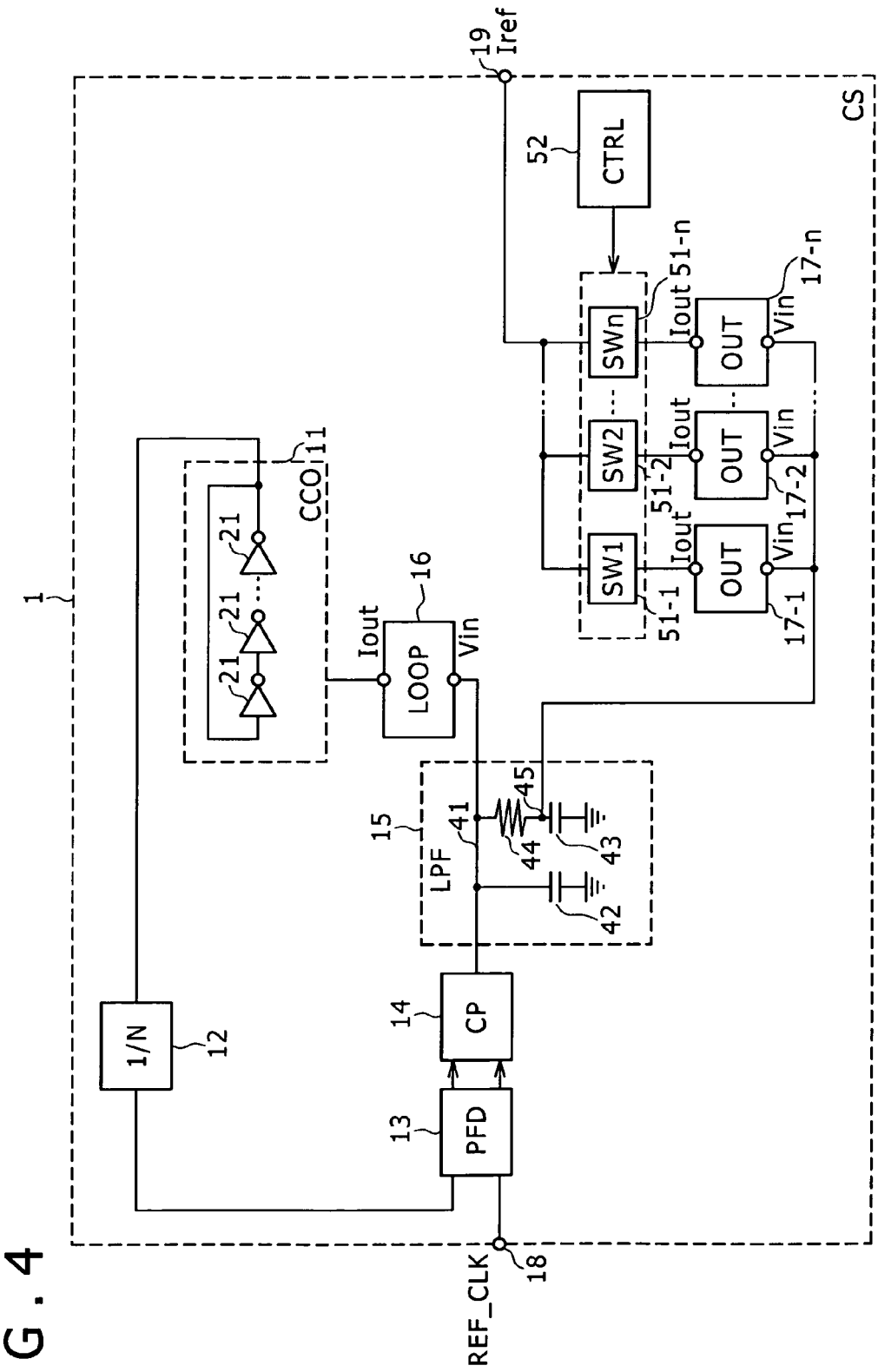
FIG. 4 is a block diagram of a constant current source according to a second embodiment of the present invention.

FIG. 4 is a block diagram of a constant current source 1 according to a second embodiment of the present invention.

The constant current source 1 of FIG. 4 is different from the constant current source 1 of FIG. 1 in that it has plural output converters (OUT) 17-1 to 17-$n$, plural switches (SW1 to SW$n$) 51-1 to 51-$n$, and a controller (CTRL) 52.

The constant current source 1 of FIG. 4 is so used as to be integrated into an integrated circuit.

The constituent element in FIG. 4 with the same functions as those in the constituent element in FIG. 1 is given the same numeral, and description thereof is omitted.

The plural output converters 17-1 to 17-$n$ are connected to the connecting node 45 of the low-pass filter 15.

The output converter 17 is e.g. the voltage-current conversion circuit 31 of FIG. 2.

The switch 51 is a switch that is opened and closed by a control signal.

The switch 51 may be e.g. a transistor.

One end of each of the plural switches 51-1 to 51-$n$ is connected to a respective one of the plural output converters 17-1 to 17-$n$.

The other end of each of the plural switches 51-1 to 51-*n* is connected to the output terminal 19 of the constant current source 1.

When the switch 51 is closed, the output converter 17 is connected to the output terminal 19 of the constant current source 1.

When the switch 51 is opened, the output converter 17 is isolated from the output terminal 19 of the constant current source 1.

The controller 52 is connected to the plural switches 51-1 to 51-*n*.

The controller 52 outputs an opening/closing control signal to each of the switches 51.

Thereby, the controller 52 controls opening and closing of the plural switches 51-1 to 51-*n*.

[Operation of Constant Current Source 1]

Upon supply of power to the integrated circuit, the current control oscillator 11 generates an oscillation signal.

The control loop configured by the frequency divider 12, the comparator 13, the charge pump 14, the low-pass filter 15, and the loop converter 16 operates in such a manner as to reduce the phase difference and the frequency difference between a reference clock signal and the oscillation signal resulting from frequency division.

If the phase difference and the frequency difference between the reference clock signal and the oscillation signal resulting from frequency division are reduced, the operating state of the control loop is stabilized.

Each output converter 17 outputs an output current dependent on the voltage of the connecting node 45 of the low-pass filter 15 to the output terminal 19 of the constant current source 1.

If the operating state of the control loop is stable, the current output by each output terminal 17 is also stable.

The controller 52 outputs the opening/closing control signal to the plural switches 51-1 to 51-*n*.

This makes the plural switches 51-1 to 51-*n* be individually opened and closed.

For example, when all the switches 51-1 to 51-*n* are closed, all the plural output converters 17-1 to 17-*n* are connected to the output terminal 19 of the constant current source 1. In this case, a combined current by the plural output converters 17-1 to 17-*n* is output from the output terminal 19.

As another case, for example when one switch 51 is closed whereas all the remaining switches 51 are opened, one output converter 17 is connected to the output terminal 19 of the constant current source 1. In this case, the current by one output converter 17 is output from the output terminal 19.

In this manner, the constant current source 1 of the second embodiment can switch the output current through the opening/closing control of the switches 51 by the controller 52.

As described above, in the constant current source 1 of the second embodiment, the output current of the constant current source 1 can be controlled and changed in a digital manner.

As a result, the constant current source 1 of the second embodiment can obtain an arbitrary output current without being limited by the voltage of the connecting node 45 in the control loop.

In the constant current source 1 of the second embodiment, the plural output converters 17-1 to 17-*n* are connected to the plural switches 51-1 to 51-*n* with one-to-one correspondence.

As another configuration, for example, one output converter 17 may have plural output transistors and plural switches 51, and the output transistor connected to the output terminal 19 may be switched inside this one output converter 17.

3. Third Embodiment

Configuration of Constant Current Source 1

Figure 5:
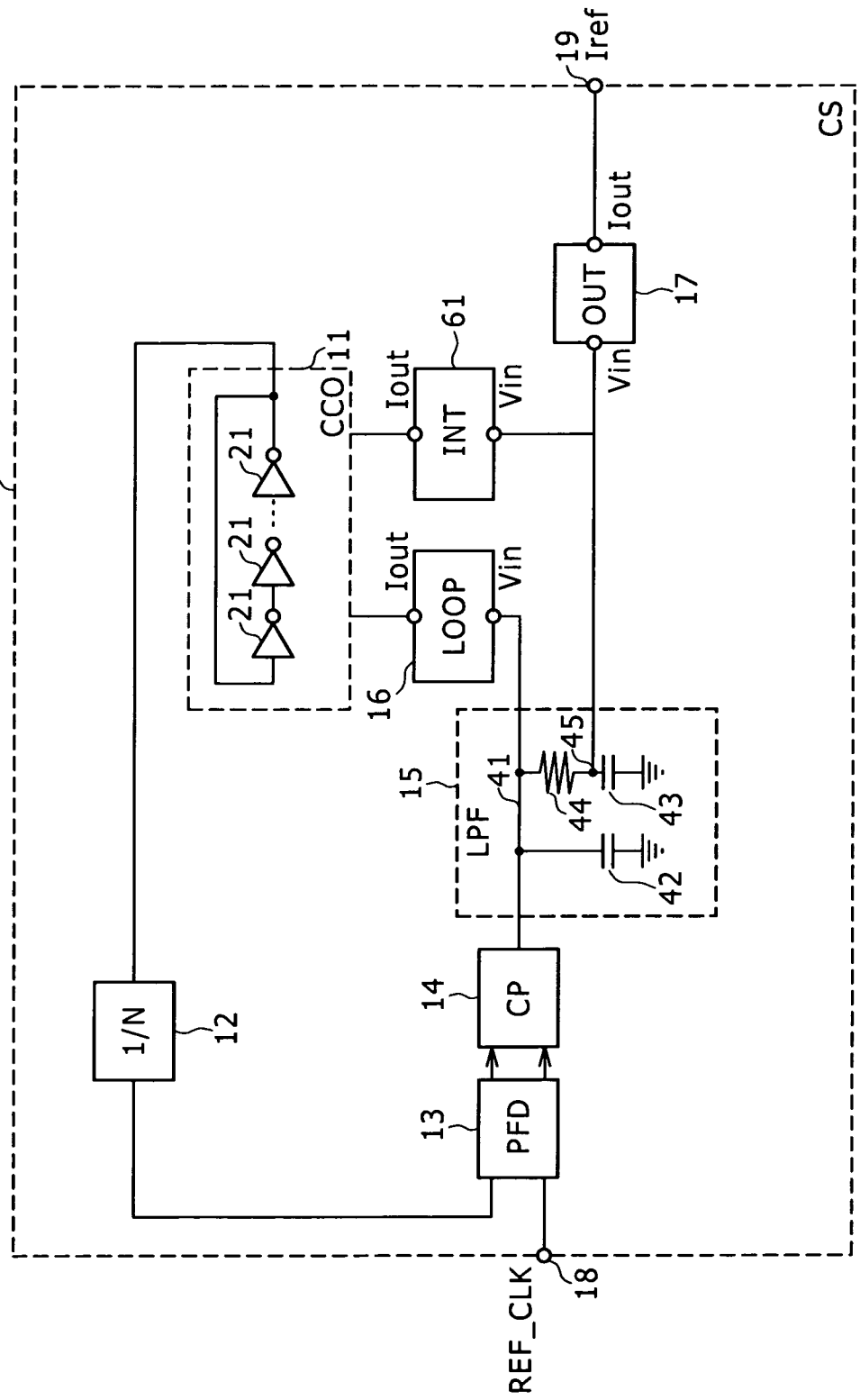
FIG. 5 is a block diagram of a constant current source according to a third embodiment of the present invention.

FIG. 5 is a block diagram of a constant current source 1 according to a third embodiment of the present invention.

The constant current source 1 of FIG. 5 is different from the constant current source 1 of FIG. 1 in that it has an internal-use converter (INT) 61.

The constant current source 1 of FIG. 5 is so used as to be integrated into an integrated circuit.

The constituent element in FIG. 5 with the same functions as those in the constituent element in FIG. 1 is given the same numeral, and description thereof is omitted.

The internal-use converter 61 is connected to the connecting node 45 of the low-pass filter 15 in parallel to the output converter 17.

The internal-use converter 61 is e.g. the voltage-current conversion circuit 31 of FIG. 2.

In this case, the input node 33 in FIG. 2 is connected to the connecting node 45 of the low-pass filter 15. The output node 34 is connected to the plural inverters 21 of the current control oscillator 11 in parallel to the loop converter 16.

When the voltage input from the connecting node 45 to the internal-use converter 61 is higher, the internal-use converter 61 by the voltage-current conversion circuit 31 of FIG. 2 draws a larger current from the current controlled oscillator.

[Operation of Constant Current Source 1]

Upon supply of power to the integrated circuit, the current control oscillator 11 generates an oscillation signal.

The control loop configured by the frequency divider 12, the comparator 13, the charge pump 14, the low-pass filter 15, and the loop converter 16 operates in such a manner as to reduce the phase difference and the frequency difference between a reference clock signal and the oscillation signal resulting from frequency division.

The internal-use converter 61 also supplies a current dependent on the voltage of the connecting node 45 to the plural inverters 21 of the current control oscillator 11.

If the phase difference and the frequency difference between the reference clock signal and the oscillation signal resulting from frequency division are reduced, the operating state of the control loop is stabilized.

If the operating state of the control loop is stable, the current supplied by the internal-use converter 61 to the plural inverters 21 of the current control oscillator 11 is also stable.

In this state, the output converter 17 outputs a stable constant current from the output terminal 19 depending on the voltage of the connecting node 45.

As described above, in the constant current source 1 of the third embodiment, the current of the loop converter 16 and the current of the internal-use converter 61 are supplied to the current control oscillator 11.

The internal-use converter 61 supplies the current dependent on the voltage of the connecting node 45 of the low-pass filter 15.

Therefore, the voltage-current conversion characteristics of the internal-use converter 61 are different from those of the loop converter 16.

For example, this constant current source 1 of the third embodiment can independently set the frequency acquisition characteristics in the control loop forming the PLL circuit in the constant current source 1 and the frequency at which the PLL circuit stably oscillates.

4. Fourth Embodiment

Configuration of Constant Current Source 1

A constant current source 1 according to a fourth embodiment of the present invention has the same block configuration as that of the constant current source 1 according to the third embodiment shown in FIG. 5, and is formed in an integrated circuit.

However, the circuit configuration of the internal-use converter 61 is different from that of FIG. 2.

Regarding constituent elements in the constant current source 1 according to the fourth embodiment, the constituent element having the same functions as those of the constituent element in the constant current source 1 according to the third embodiment is given the same numeral, and description thereof is omitted.

Figure 6:
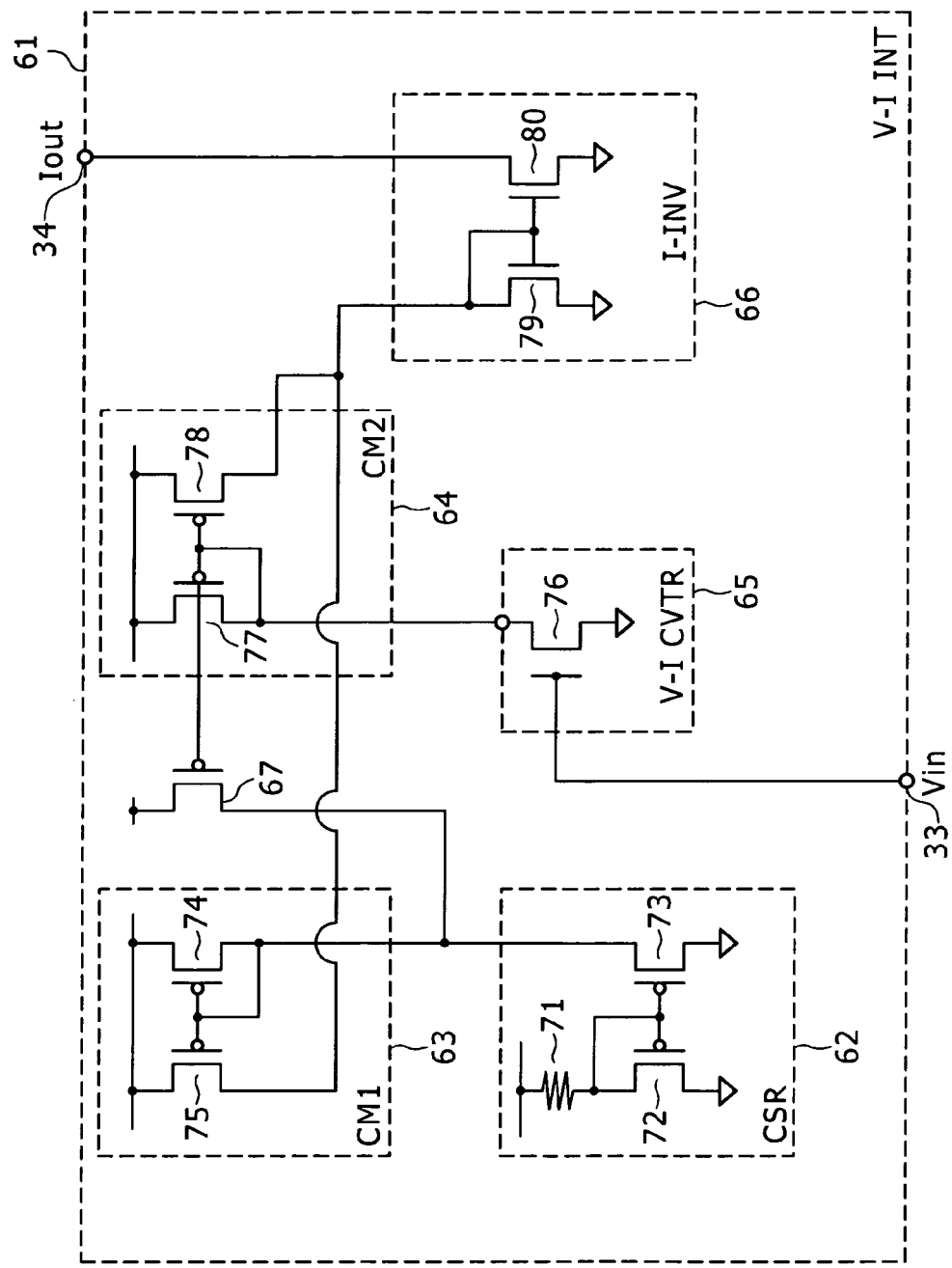
FIG. 6 is a circuit diagram of an internal-use converter in a fourth embodiment of the present invention.

FIG. 6 is a circuit diagram of the internal-use converter (V-I INT) 61 in the fourth embodiment.

The internal-use converter 61 of FIG. 6 has a current supply unit (CSR) 62, a first current mirror circuit (CM1) 63, a second current mirror circuit (CM2) 64, a voltage-current conversion circuit (V-I CVTR) 65, a current inversion circuit (I-INV) 66, and an adjustment transistor 67.

Furthermore, the internal-use converter 61 has an input node 33 and an output node 34.

The current supply unit 62 has a resistance element 71 and a pair of N-ch transistors 72 and 73.

One end of the resistance element 71 of the current supply unit 62 is connected to the power supply of the higher voltage side of the integrated circuit. The other end of the resistance element 71 is connected to the drain electrode of one transistor 72.

The source electrode of this one transistor 72 is connected to the ground of the integrated circuit. The gate electrode of this one transistor 72 is connected to the drain electrode.

Thereby, this one transistor 72 is diode-connected.

The gate electrode of the other transistor 73 of the current supply unit 62 is connected to the gate electrode of diode-connected one transistor 72.

The source electrode of the other transistor 73 is connected to the ground of the integrated circuit.

Upon supply of power to the integrated circuit, a current flows through the resistance element 71 and diode-connected one transistor 72 in the current supply unit 62.

The potential of the gate electrode of one transistor 72 is equal to the potential of the gate electrode of the other transistor 73.

Thus, the same current as that of one transistor 72 flows between the source electrode and the drain electrode of the other transistor 73.

The first current mirror circuit 63 has a pair of P-ch transistors 74 and 75.

The source electrodes of the pair of transistors 74 and 75 are connected to the power supply of the higher voltage side of the integrated circuit.

The gate electrode of one transistor 74 of the first current mirror circuit 63 is connected to the gate electrode of the other transistor 75.

The drain electrode of one transistor 74 is connected to the gate electrode of one transistor 74.

Thereby, a current mirror structure is formed.

The current supplied from the current supply unit 62 flows through diode-connected one transistor 74 in the first current mirror circuit 63.

Thus, the same current as that of one transistor 74 flows between the source electrode and the drain electrode of the other transistor 75.

The voltage-current conversion circuit 65 has one N-ch transistor 76.

The source electrode of the transistor 76 is connected to the ground of the integrated circuit. The gate electrode is connected to the input node 33. The input node 33 is connected to the connecting node 45 of the low-pass filter 15.

The drain electrode is connected to the drain electrode of one transistor 77 of the second current mirror circuit 64 to be described later.

The voltage-current conversion circuit 65 outputs a current dependent on the voltage of the connecting node 45 of the low-pass filter 15.

The second current mirror circuit 64 has a current mirror structure by a pair of P-ch transistors 77 and 78 similarly to the first current mirror circuit 63.

The current supplied from the voltage-current conversion circuit 65 flows through diode-connected one transistor 77.

The potential of the gate electrode of one transistor 77 is equal to the potential of the gate electrode of the other transistor 78.

Thus, the same current as that of one transistor 77 flows between the source electrode and the drain electrode of the other transistor 78.

The current inversion circuit 66 has a pair of N-ch transistors 79 and 80.

The source electrodes of the pair of transistors 79 and 80 are connected to the ground of the integrated circuit.

The gate electrode of one transistor 79 of the current inversion circuit 66 is connected to the gate electrode of the other transistor 80.

The drain electrode of one transistor 79 is connected to the gate electrode of one transistor 79, the drain electrode of the other transistor 75 of the first current mirror circuit 63, and the drain electrode of the other transistor 78 of the second current mirror circuit 64.

The drain electrode of the other transistor 80 is connected to the output node 34 of the internal-use converter 61.

The output node 34 of this internal-use converter 61 is connected to the current control oscillator 11 as shown in FIG. 5.

To diode-connected one transistor 79 in the current inversion circuit 66, the current of the first current mirror circuit 63 and the current of the second current mirror circuit 64 are supplied.

The potential of the gate electrode of one transistor 79 is equal to the potential of, the gate electrode of the other transistor 80.

Thus, the same current as that of one transistor 79 flows between the source electrode and the drain electrode of the other transistor 80.

This current is equivalent to the sum of a first current generated by the first current mirror circuit 63 based on the current output by the current supply unit 62 and a second current generated by the second current mirror circuit 64 based on the current output by the voltage-current conversion circuit 65.

The adjustment transistor 67 is one P-ch transistor.

The source electrode of the adjustment transistor 67 is connected to the power supply of the higher voltage side of the integrated circuit.

The gate electrode is connected to the gate electrode of one transistor 77 of the second current mirror circuit 64.

The drain electrode is connected to the drain electrode of one transistor 74 of the first current mirror circuit 63.

[Activation Operation of Constant Current Source 1]

Upon supply of power to the integrated circuit, in the internal-use converter 61, the current supply unit 62 operates, so that the first current mirror circuit 63 supplies the first current I1 to the current inversion circuit 66.

In this case, the current supplied to the current control oscillator 11 by the current inversion circuit 66 is the first current.

The current control oscillator 11 starts operation by this first current and the current supplied from the loop converter 16, and generates an oscillation signal based on the delay time dependent on the current as the sum of these currents.

Furthermore, the control loop of the constant current source 1 carries out feedback control so that the phase difference and the frequency difference between the oscillation signal resulting from frequency division and a reference clock signal may be reduced.

Thereby, the smoothing capacitor 42 and the second capacitor 43 of the low-pass filter 15 are charged.

Upon the start of the charge of the second capacitor 43, the voltage-current conversion circuit 65 supplies a current to the second current mirror circuit 64.

The second current mirror circuit 64 supplies the second current I2 to the current inversion circuit 66.

In response to the start of the current supply by the second current mirror circuit 64, the adjustment transistor 67 enters the on-state.

The adjustment transistor 67 draws part of the first current I1 supplied to the first current mirror circuit 63 by the current supply unit 62.

Thus, upon the start of the current supply by the second current mirror circuit 64, the current flowing through one transistor 74 of the first current mirror circuit 63 decreases, so that the current output by the first current mirror circuit 63 decreases.

The amount of decrease in the output current of the first current mirror circuit 63 is equal to the amount of increase in the second current I2.

As a result, in the period until the operation of the control loop is stabilized, the current output by the current inversion circuit 66 changes from the first current I1 to the second current I2.

If the phase difference and the frequency difference between the oscillation signal resulting from frequency division and the reference clock signal become sufficiently small, the charge voltage of the smoothing capacitor 42 and the second capacitor 43 of the low-pass filter 15 is stabilized.

If the second current I2 in the stable state is larger than the first current I1, the sum current output by the current inversion circuit 66 in the stable state is the second current I2.

In this manner, the internal-use converter 61 of FIG. 6 in the fourth embodiment changes the current supplied to the current control oscillator 11 from the first current I1 to the second current I2 in the period from the start of the supply of power to the integrated circuit to the achievement of the stable state.

As described above, in the constant current source 1 of the fourth embodiment, the internal-use converter 61 changes the current supplied to the current control oscillator 11 in the range from the first current I1 to the second current I2.

Figure 7:
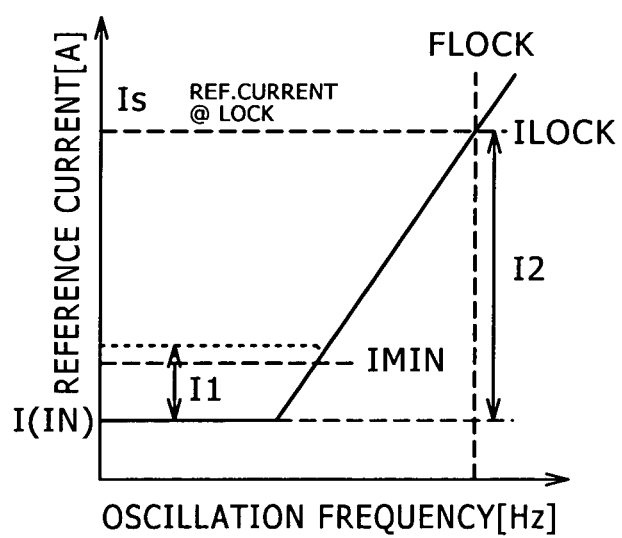
FIG. 7 is a characteristic diagram showing the relationship between the drive current and the oscillation frequency in a current control oscillator in the fourth embodiment of the present invention.

FIG. 7 is a characteristic diagram showing the relationship between the drive current and the oscillation frequency in the current control oscillator 11.

In FIG. 7, a characteristic line of the current control oscillator 11 is diagrammatically represented.

For example, the current value of the loop converter 16 is I (IN). Even if this current value I (IN) is smaller than the necessary minimum current IMIN for making the current control oscillator 11 oscillate at a predetermined frequency, the insufficient current can be covered by the first current I1.

In this case, a current ILOCK supplied to the current control oscillator 11 when the frequency is stable has the current value obtained by adding the current value I (IN) of the loop converter 16 to the second current I2. At this timing, the first current I1 is not used.

In the fourth embodiment, the switching between the first current I1 and the second current I2 is automatically carried out by using the adjustment transistor 67. However, the switching between the first current I1 and the second current I2 may be carried out by manual setting.

5. Fifth Embodiment

Configuration of Constant Current Source 1

Figure 8:
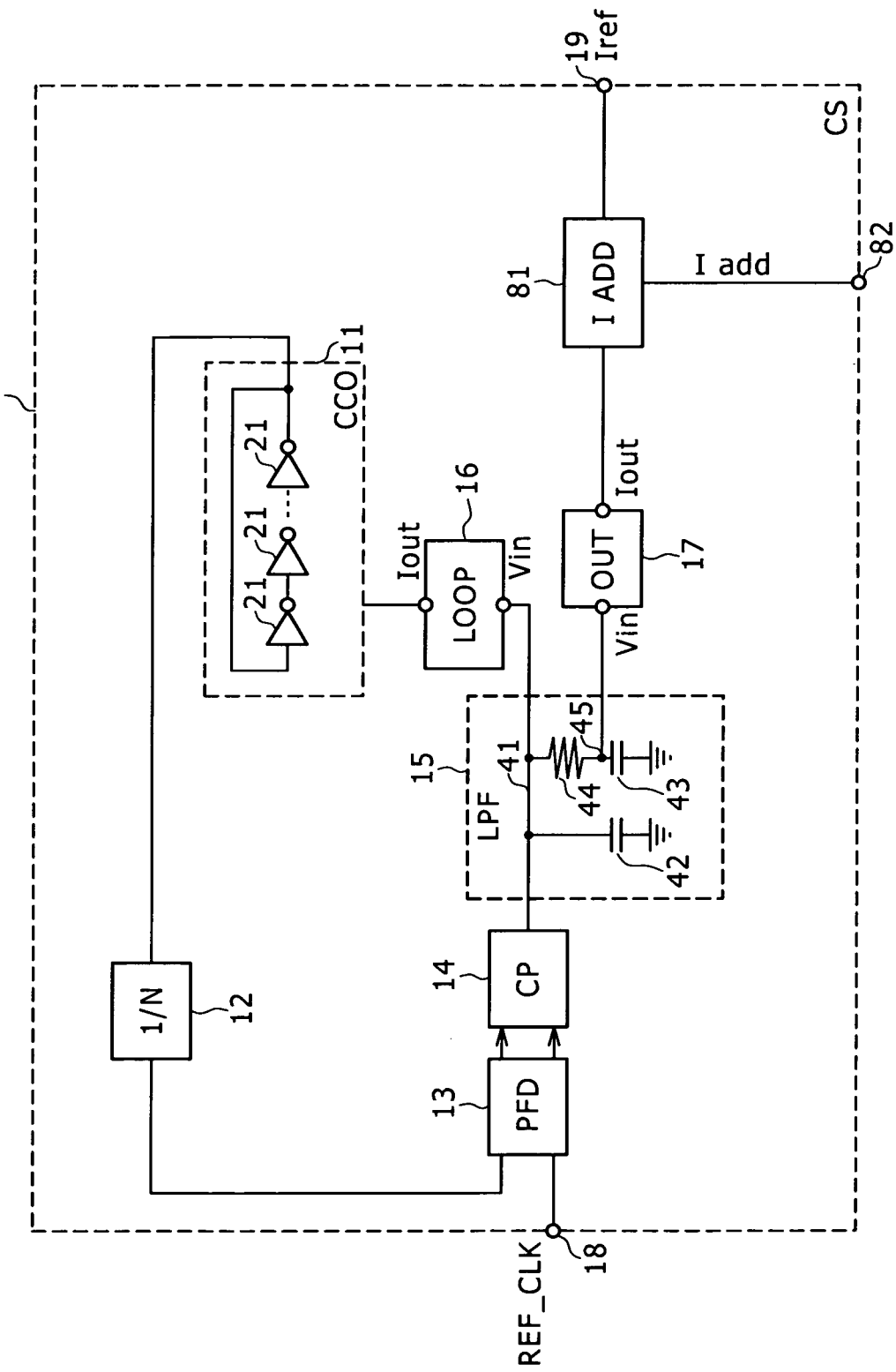
FIG. 8 is a block diagram of a constant current source according to a fifth embodiment of the present invention.

FIG. 8 is a block diagram of a constant current source 1 according to a fifth embodiment of the present invention.

The constant current source 1 according to the fifth embodiment has a block configuration obtained by adding a current combiner (I ADD) 81 to the constant current source 1 according to the first embodiment shown in FIG. 1, and is formed in an integrated circuit.

The current combiner 81 is connected between the output converter 17 and the output terminal 19.

Furthermore, the current combiner 81 is connected to an auxiliary current terminal 82.

An auxiliary current Iadd is supplied from the outside of the constant current source 1 to the auxiliary current terminal 82.

Regarding constituent elements in the constant current source 1 according to the fifth embodiment, the constituent element having the same functions as those of the constituent element in the constant current source 1 according to the first embodiment is given the same numeral, and description thereof is omitted.

Figure 9:
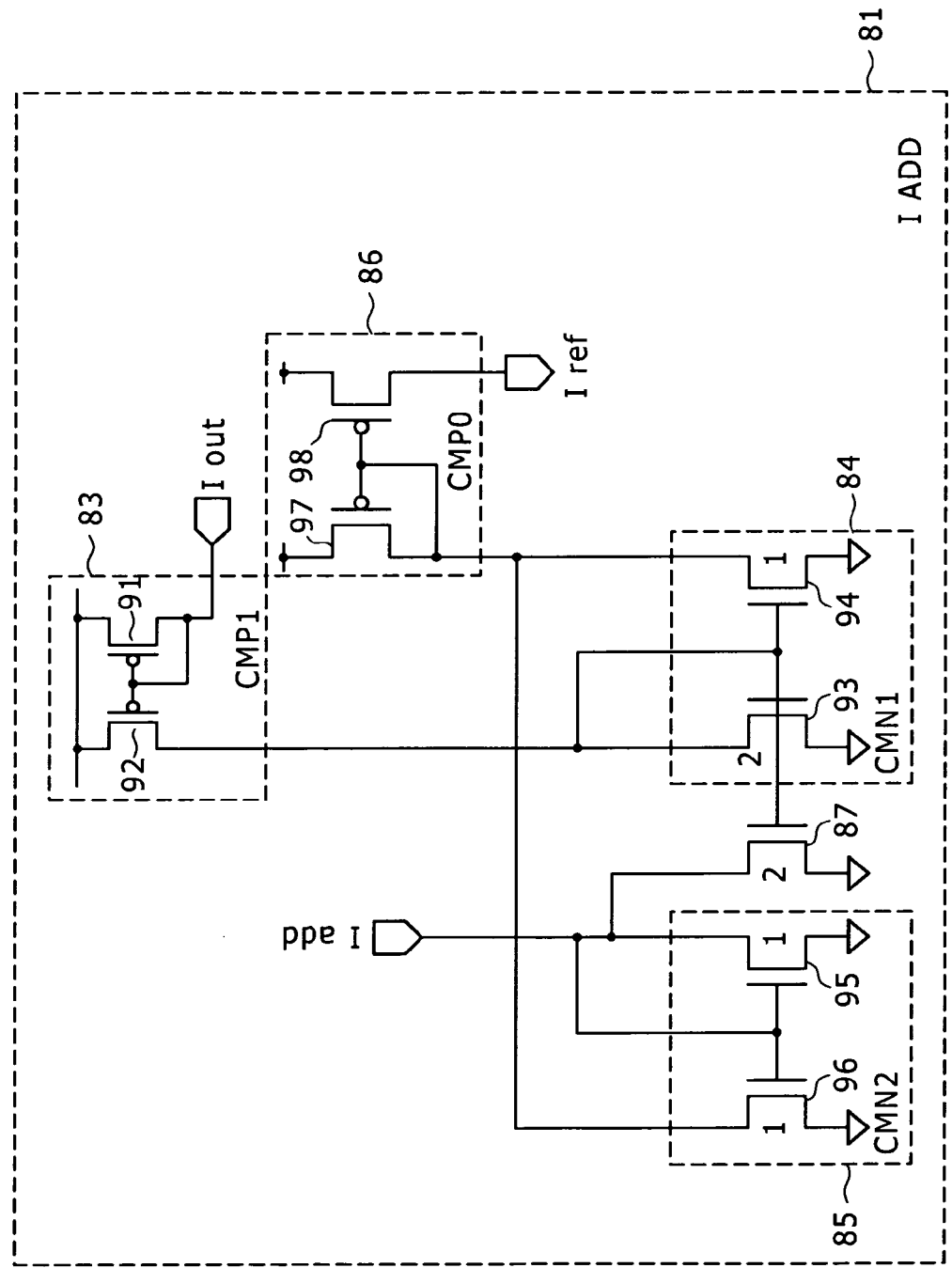
FIG. 9 is a circuit diagram of a current combiner in FIG. 8.

FIG. 9 is a circuit diagram of the current combiner 81 in FIG. 8.

The current combiner 81 has a P-type first current mirror circuit (CMP1) 83, an N-type first current mirror circuit (CMN1) 84, an N-type second current mirror circuit (CMN2) 85, an N-type adjustment transistor 87, and an output current mirror circuit (CMPO) 86.

The P-type first current mirror circuit 83 has a pair of P-ch transistors 91 and 92.

The source electrodes of the pair of transistors 91 and 92 are connected to the power supply of the higher voltage side of the integrated circuit.

The gate electrode of one transistor 91 is connected to the gate electrode of the other transistor 92.

The drain electrode of one transistor 91 is connected to the gate electrode of one transistor 91 and the output converter 17.

Thereby, a current mirror structure is formed.

A current Iout supplied from the output converter 17 flows through diode-connected one transistor 91 in the P-type first current mirror circuit 83.

The potential of the gate electrode of one transistor 91 is equal to the potential of the gate electrode of the other transistor 92.

Thus, the same current as that of one transistor 91 flows between the source electrode and the drain electrode of the other transistor 92.

The N-type first current mirror circuit 84 has a pair of N-ch transistors 93 and 94.

The source electrodes of the pair of transistors 93 and 94 are connected to the power supply of the lower voltage side (ground) of the integrated circuit.

The gate electrode of one transistor 93 is connected to the gate electrode of the other transistor 94.

The drain electrode of one transistor 93 is connected to the gate electrode of one transistor 93 and the drain electrode of the other transistor 92 of the P-type first current mirror circuit 83.

Thereby, a current mirror structure is formed.

The current Iout supplied from the P-type first current mirror circuit 83 flows through diode-connected one transistor 93 in the N-type first current mirror circuit 84.

The potential of the gate electrode of one transistor 93 is equal to the potential of the gate electrode of the other transistor 94.

Thus, the same current as that of one transistor 93 flows between the source electrode and the drain electrode of the other transistor 94. That is, the current Iout flows.

The N-type second current mirror circuit 85 has a pair of N-ch transistors 95 and 96.

The source electrodes of the pair of transistors 95 and 96 are connected to the power supply of the lower voltage side of the integrated circuit.

The gate electrode of one transistor 95 is connected to the gate electrode of the other transistor 96.

The drain electrode of one transistor 95 is connected to the gate electrode of one transistor 95 and the auxiliary current terminal 82.

Thereby, a current mirror structure is formed.

The auxiliary current Iadd supplied from the auxiliary current terminal 82 flows through diode-connected one transistor 95 in the N-type second current mirror circuit 85.

The potential of the gate electrode of one transistor 95 is equal to the potential of the gate electrode of the other transistor 96.

Thus, the same current as that of one transistor 95 flows between the source electrode and the drain electrode of the other transistor 96. That is, the auxiliary current Iadd flows.

The output current mirror circuit 86 has a pair of P-ch transistors 97 and 98.

The source electrodes of the pair of transistors 97 and 98 are connected to the power supply of the higher voltage side of the integrated circuit.

The gate electrode of one transistor 97 is connected to the gate electrode of the other transistor 98.

The drain electrode of one transistor 97 is connected to the gate electrode of one transistor 97, the drain electrode of the other transistor 94 of the N-type first current mirror circuit 84, and the drain electrode of the other transistor 96 of the N-type second current mirror circuit 85.

Thereby, a current mirror structure is formed.

The current Iout supplied from the N-type first current mirror circuit 84 and the current Iadd supplied from the N-type second current mirror circuit 85 flow through diode-connected one transistor 97 in the output current mirror circuit 86.

The potential of the gate electrode of one transistor 97 is equal to the potential of the gate electrode of the other transistor 98.

Thus, the same current as that of one transistor 97 flows between the source electrode and the drain electrode of the other transistor 98.

Specifically, the combined current flows that is obtained by combining the current Iout supplied from the N-type first current mirror circuit 84 and the current Iadd supplied from the N-type second current mirror circuit 85.

The N-type adjustment transistor 87 is one N-ch transistor.

The source electrode of the N-type adjustment transistor 87 is connected to the power supply of the lower voltage side of the integrated circuit.

The gate electrode is connected to the gate electrode of one transistor 93 of the N-type first current mirror circuit 84.

The drain electrode is connected to the drain electrode of one transistor 95 of the N-type second current mirror circuit 85.

[Activation Operation of Constant Current Source 1]

Upon supply of the auxiliary current Iadd from the auxiliary current terminal 82, the N-type second current mirror circuit 85 of the current combiner 81 folds back this auxiliary current.

Thereby, the auxiliary current Iadd is input to the output current mirror circuit 86: The output current mirror circuit 86 outputs the auxiliary current Iadd to the output terminal 19.

Upon supply of power to the integrated circuit, the output converter 17 outputs the output current Iout.

The P-type first current mirror circuit 83 and the N-type first current mirror circuit 84 in the current combiner 81 fold back this output current.

However, the gate electrode of the N-type adjustment transistor 87 is connected to the gate electrode of the transistor 93 of the N-type first current mirror circuit 84. Furthermore, the drain electrode of the N-type adjustment transistor 87 is connected to the auxiliary current terminal 82.

Thus, the N-type adjustment transistor 87 draws the current equivalent to the output current Iout from the auxiliary current input from the auxiliary current terminal 82

As a result, the currents supplied from the N-type first current mirror circuit 84 and the N-type second current mirror circuit 85 to the output current mirror circuit 86 are in the following relationship.

For example, if the auxiliary current is larger than the output current of the output converter 17, the auxiliary current is supplied to the output current mirror circuit 86.

If the output current of the output converter 17 is equal to or larger than the auxiliary current, the output current is supplied to the output current mirror circuit 86.

The output current mirror circuit 86 folds back the input current and outputs the current to the output terminal 19.

Due to this operation, for example even if a sufficient output current is not output from the output converter 17 in the activation period immediately after the power supply is turned on, a load circuit connected to the output terminal 19 of the current source 1 is supplied with at least the auxiliary current.

The load circuit can rapidly start operation by the auxiliary current.

Specific Example

A specification example of the circuit of FIG. 9 will be described below.

The following description will be made by taking as an example the case in which the current flow of the N-type transistor 93 and the N-type adjustment transistor 87 is double the current flow of the other N-type transistors 94, 95, and 96 when the same gate-source voltage is applied.

For example, each of the N-type transistor 93 and the N-type adjustment transistor 87 is configured by two transistors, whereas each of the other N-type transistors 94, 95, and 96 is configured by one transistor. This can realize the above-described relationship between the current flow through transistor.

The output current Iout of the output converter 17 flows through one N-type transistor 93 of the N-type first current mirror circuit 84. At this time, the output current Iout flows also through the N-type adjustment transistor 87.

If the output current Iout is smaller than the auxiliary current Iadd, the current flowing through the N-type transistors 95 and 96 is the current obtained by subtracting the output current Iout from the auxiliary current Iadd.

The current flowing through the N-type transistor 94 is half the output current Iout.

Therefore, if the output current Iout is smaller than the auxiliary current Iadd, a current equal to (Iadd−Iout/2) flows through the transistors 97 and 98 of the output current mirror circuit 86.

If the output current Iout is equal to or larger than the auxiliary current Iadd, no current flows through the N-type transistors 95 and 96.

The current flowing through the N-type transistor 94 is half the output current Iout.

Therefore, if the output current Iout is equal to or larger than the auxiliary current Iadd, a current equal to (Iout/2) flows through the transistors 97 and 98 of the output current mirror circuit 86.

As just described, in the specific example of the circuit of FIG. 9, a current can continue to be output from the current source 1 by supplying the current half the output current obtained when the operation is stable as the auxiliary current for example.

Furthermore, in the circuit of FIG. 9, a current larger than the output current can be supplied to the load circuit by setting the auxiliary current larger than the output current obtained when the operation is stable.

In addition, in the circuit of FIG. 9, the auxiliary current or the output current can be supplied to the load circuit with switching between these currents by switching the auxiliary current.

6. Sixth Embodiment

Configuration of Electronic Apparatus

Figure 10:
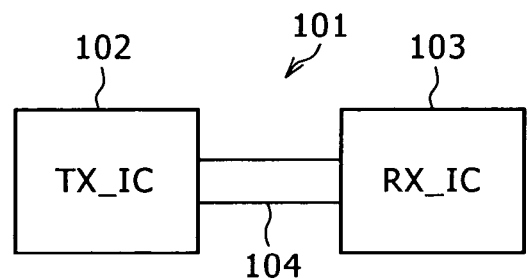
FIG. 10 is a device configuration diagram of a signal transmission device according to a sixth embodiment of the present invention.

FIG. 10 is a device configuration diagram of a signal transmission device 101 according to a sixth embodiment of the present invention.

The signal transmission device 101 of FIG. 10 has a transmission IC (TX-IC) 102, a reception IC (RX-IC) 103, and inter-chip signal lines 104 to interconnect these ICs.

The transmission IC 102 and the reception IC 103 are ICs for high-speed serial communication.

The signal lines 104 are e.g. a pair of interconnects formed on an IC-mounted board.

The transmission IC 102 transmits a differential signal of small amplitude (low voltage differential signal (LVDS)) to the pair of interconnects.

The reception IC 103 receives the differential signal of small amplitude from the pair of interconnects.

Thereby, the transmission IC 102 performs high-speed serial communication of data to the reception IC 103.

Figure 11:
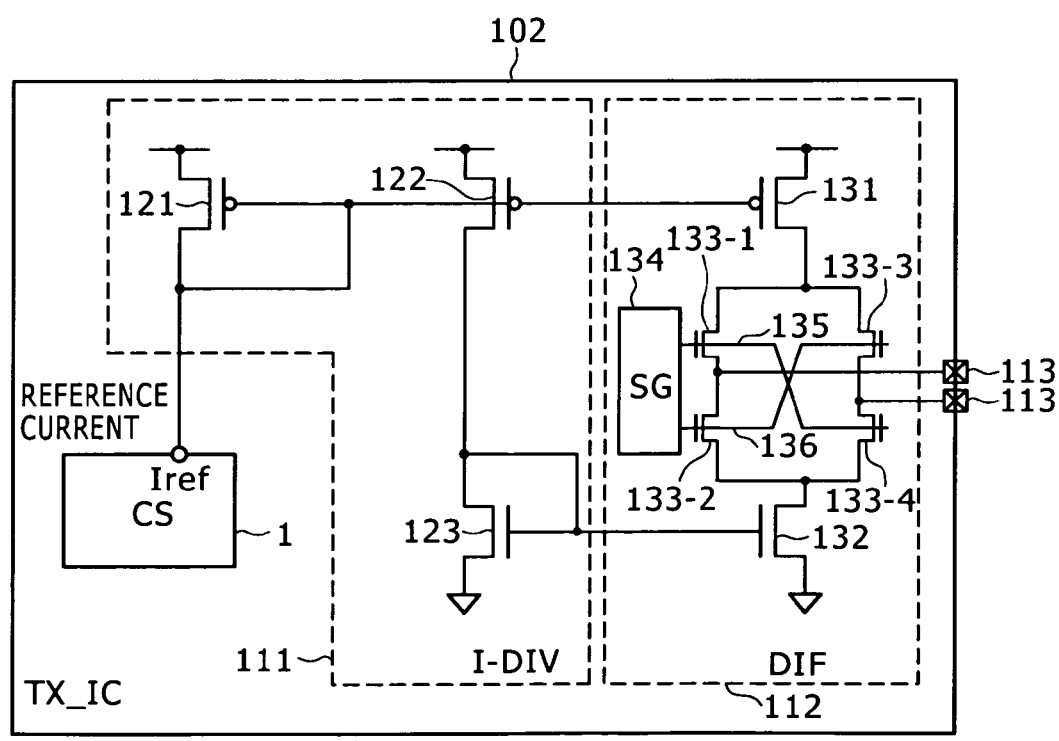
FIG. 11 is a block diagram of the schematic configuration of a transmission IC in FIG. 10.

FIG. 11 is a block diagram of the schematic configuration of the transmission IC 102 in FIG. 10.

The transmission IC 102 of FIG. 11 has a constant current source (CS) 1, a current divider (I-DIV) 111, a differential signal generator (DIF) 112, and a pair of differential signal output terminals 113.

The differential signal generator 112 is an input-subject unit that operates by the output current of the constant current source 1.

The constant current source 1 is e.g. the constant current source 1 of the first embodiment of FIG. 1.

The constant current source 1 outputs a constant current.

Instead of this, the constant current source 1 may be the constant current source 1 of any of the second to fifth embodiments of FIGS. 4, 5, and so forth.

These constant current sources 1 output a stable constant current through e.g. supply of power to the transmission IC 102 and supply of a reference clock signal to the transmission IC 102.

It is also possible to generate the reference clock signal inside the transmission IC 102.

The current divider 111 divides and supplies a current based on the output current of the constant current source 1 to a circuit that operates by the output current of the constant current source 1.

The current divider 111 in FIG. 11 has a first P-ch transistor 121, a second P-ch transistor 122, and a first N-ch transistor 123.

The source electrode of the first P-ch transistor 121 is connected to the power supply of the higher voltage side of the transmission IC 102. The gate electrode and the drain electrode are connected to the constant current source 1. The first P-ch transistor 121 is diode-connected.

The source electrode of the second P-ch transistor 122 is connected to the power supply of the higher voltage side of the transmission IC 102. The gate electrode is connected to the gate electrode of the first P-ch transistor.

The source electrode of the first N-ch transistor 123 is connected to the ground of the transmission IC 102. The drain electrode is connected to its gate electrode and the drain electrode of the second P-ch transistor 122.

The differential signal generator 112 is a circuit that operates by the output current of the constant current source 1.

The differential signal generator 112 in FIG. 11 has a third P-ch transistor 131, a second N-ch transistor 132, four switch transistors 133-1 to 133-4, and a signal controller 134.

The source electrode of the third P-ch transistor 131 is connected to the power supply of the higher voltage side of the transmission IC 102, and the gate electrode is connected to the gate electrode of the first P-ch transistor 121.

The source electrode of the second N-ch transistor 132 is connected to the ground of the transmission IC 102. The gate electrode is connected the gate electrode of the first N-ch transistor 123 at the center of FIG. 11.

Due to the above-described connection structure, the third P-ch transistor 131 and the second N-ch transistor 132 output substantially the same current as that supplied from the constant current source 1.

Four switch transistors 133-1 to 133-4 are connected in series two by two.

In FIG. 11, the upper left first switch transistor 133-1 and the lower left second switch transistor 133-2 are connected in series. In addition, the upper right third switch transistor 133-3 and the lower right fourth switch transistor 133-4 are connected in series.

The drain electrode of the first switch transistor 133-1 and the drain electrode of the second switch transistor 133-2 are connected to one differential signal output terminal 113.

The drain electrode of the third switch transistor 133-3 and the drain electrode of the fourth switch transistor 133-4 are connected to the other differential signal output terminal 113.

Two rows of switch transistors 133 connected in series are connected in parallel between the third P-ch transistor 131 and the second N-ch transistor 132.

The signal controller 134 is connected to four switch transistors 133 by two control lines 135 and 136.

In FIG. 11, one control line 135 is connected to the gate electrode of the upper left first switch transistor 133-1 and the gate electrode of the lower right fourth switch transistor 133-4.

The other control line 136 is connected to the gate electrode of the lower left second switch transistor 133-2 and the gate electrode of the upper right third switch transistor 133-3.

[Operation of Electronic Apparatus]

The signal controller 134 sets one of two control lines 135 and 136 to the high level and sets the other to the low level based on data to be transmitted from the transmission IC 102 to the reception IC 103.

For example, if data to be transmitted is 1, the signal controller 134 sets one control line 135 to the high level and sets the other control line 136 to the low level.

In this case, the upper left first switch transistor 133-1 and the lower right fourth switch transistor 133-4 enter the on-state.

Furthermore, the lower left second switch transistor 133-2 and the upper right third switch transistor 133-3 enter the off-state.

Thus, one differential signal output terminal 113 is connected to the third P-ch transistor 131 of the differential signal generator 112 by the first switch transistor 133-1, and is set to the high level.

The other differential signal output terminal 113 is connected to the second N-ch transistor 132 of the differential signal generator 112 by the fourth switch transistor 133-4, and is set to the low level.

As another case, for example if data to be transmitted is 0, the signal controller 134 sets one control line 135 to the low level and sets the other control line 136 to the high level.

In this case, the upper left first switch transistor 133-1 and the lower right fourth switch transistor 133-4 enter the off-state.

Furthermore, the lower left second switch transistor 133-2 and the upper right third switch transistor 133-3 enter the on-state.

Thus, one differential signal output terminal 113 is connected to the second N-ch transistor 132 of the differential signal generator 112 by the second switch transistor 133-2, and is set to the low level.

The other differential signal output terminal 113 is connected to the third P-ch transistor 131 of the differential signal generator 112 by the third switch transistor 133-3, and is set to the high level.

The signal controller 134 switches four switch transistors 133 between the on-state and the off-state at high speed in accordance with the value of data to be transmitted.

Thereby, the transmission IC 102 transmits the differential signal of small amplitude to the reception IC 103.

As described above, by the transmission IC 102 or the reception IC 103 of the sixth embodiment shown in FIG. 10, high-speed serial communication among plural ICs is enabled.

In the case of performing high-speed serial communication among plural ICs or among plural boards in this manner, normally a signal having amplitude smaller than that of the internal logic voltage of the IC is used in this communication. As for the LVDS, a signal having amplitude of e.g. 0.35 V is used.

Therefore, for the IC that performs the high-speed serial communication, the constant current source 1, which stably operates with high accuracy even by a low voltage, should be used.

In the SerDes (serializer and deserializer) used in the high-speed serial communication, data is parallel-serial converted or serial-parallel converted.

In these kinds of conversion processing, a multiphase clock signal or a multiplied clock signal having a frequency higher than that of the clock signal used in the IC is used.

These clock signals can be generated by a PLL circuit.

Therefore, in the transmission IC 102 for high-speed serial communication according to the sixth embodiment, the constant current source 1 of the embodiment of the present invention can be realized by adding the output converter 17 to an existing PLL circuit for high-speed serial communication.

Thus, the mounting area for mounting the constant current source 1 can be greatly reduced. Furthermore, the constant current source 1 of the embodiment of the present invention outputs a stable constant current in low-voltage driving.

Variation of the output current of the constant current source 1 attributed to supply voltage variation is one of the factors in external radiation noise (EMI).

The output current of the constant current source 1 of the embodiment of the present invention has high tolerance to supply voltage variation, and therefore involves little external radiation noise.

The transmission IC 102 or the reception IC 103 in FIG. 10 has a low-EMI interface.

7. Comparative Example 1

Figure 12:
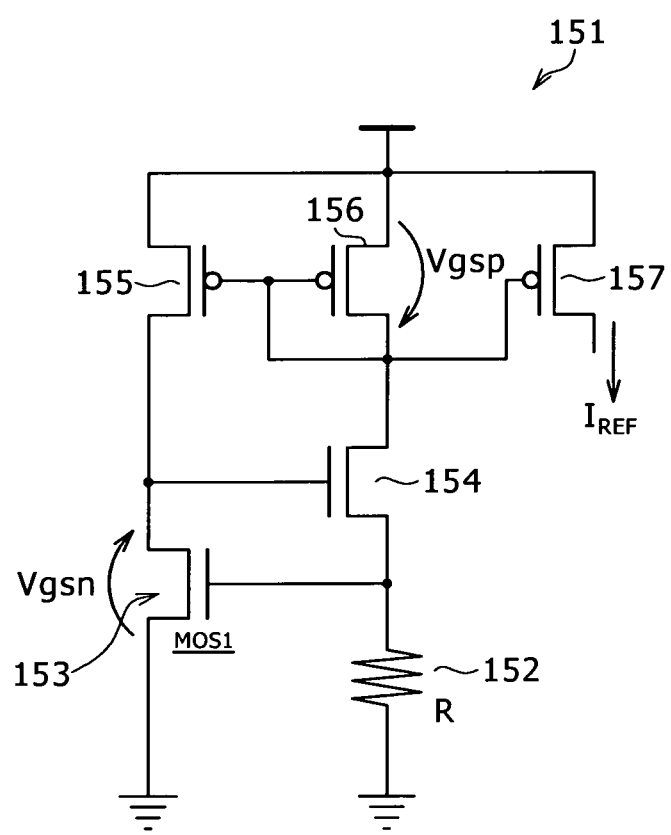
FIG. 12 is a circuit diagram of a first current source according to a comparative example.

FIG. 12 is a circuit diagram of a first current source 151 according to a comparative example.

The current source of FIG. 12 is a general current source that generates an output current by a current mirror circuit.

The first current source 151 has a resistance element 152, a first N-ch transistor 153, a second N-ch transistor 154, a first P-ch transistor 155, a second P-ch transistor 156, and a third P-ch transistor 157.

One end of the resistance element 152 is connected to the ground.

The other end of the resistance element 152 is connected to the source electrode of the second N-ch transistor 154.

The drain electrode of the second N-ch transistor 154 is connected to the drain electrode of the second P-ch transistor 156.

The source electrode of the second P-ch transistor 156 is connected to the power supply of the higher voltage side.

The gate electrode of the second P-ch transistor 156 is diode-connected to the drain electrode.

The source electrode of the first N-ch transistor 153 is connected to the ground.

The drain electrode of the first N-ch transistor 153 is connected to the drain electrode of the first P-ch transistor 155.

The source electrode of the first P-ch transistor 155 is connected to the power supply of the higher voltage side.

The gate electrode of the first N-ch transistor 153 is connected to the other end of the resistance element 152.

The gate electrode of the second N-ch transistor 154 is connected to the drain electrode of the first N-ch transistor 153.

The gate electrode of the first P-ch transistor 155 is connected to the gate electrode of the second P-ch transistor 156.

Due to the above-described current mirror configuration, substantially the same current flows through the first P-ch transistor 155 and the second P-ch transistor 156 in the current source 151 of FIG. 12.

The source electrode of the third P-ch transistor 157 is connected to the power supply of the higher voltage side, and the gate electrode is connected to the gate electrode of the second P-ch transistor 156.

Due to this connection, substantially the same current as that of the second P-ch transistor 156 flows through the third P-ch transistor 157.

This current is the output current of the first current source 151 of FIG. 12.

The current output by the first current source 151 of FIG. 12 is represented by Expression 1 shown below.

In Expression 1, R denotes the resistance value of the resistance element 152, VT1 denotes the threshold voltage of the first N-ch transistor 153, and β1 denotes the transconductance parameter.

$$I_{REF} = \frac{V_{T1}}{R} + \frac{1}{\beta_1 R^2} + \frac{1}{R}\sqrt{\frac{2V_{T1}}{\beta_1 R} + \frac{1}{\beta_1^2 R^2}} \quad \text{(Expression 1)}$$

As shown by Expression 1, the current output by the first current source 151 of FIG. 12 has low sensitivity to supply voltage variation.

However, the current output by the first current source 151 of FIG. 12 has strong dependency on manufacturing variation of the resistance element 152 and the transistors included in the current source and strong dependency on the element temperatures of them.

Therefore, it is difficult to use the first current source 151 of FIG. 12 for a use purpose requiring the accuracy of the absolute value of the current.

Furthermore, the first current source 151 of FIG. 12 requires a voltage higher than 2VT as the minimum drive voltage for operation as a current source as shown by Expression 2 shown below.

Therefore, the first current source 151 of FIG. 12 requires a supply voltage higher than that of the constant current sources 1 of the first to fifth embodiments of the present invention, and cannot be used in an integrated circuit that is driven by a low voltage.

In Expression 2, Vgsn denotes the gate-source voltage of the first N-ch transistor 153 and Vgsp denotes the gate-source voltage of the diode-connected second P-ch transistor 156.

$$Vgsn + Vgsp + RI_{REF} > 2V_T \quad \text{(Expression 2)}$$

8. Comparative Example 2

Figure 13:
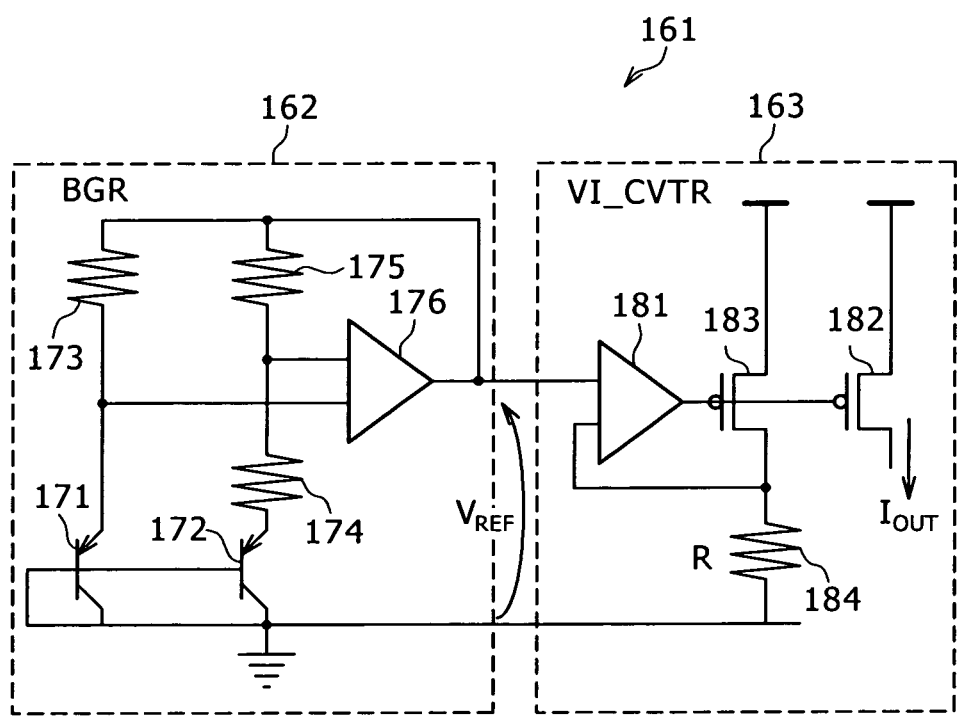
FIG. 13 is a block diagram of a second current source according to a comparative example.

FIG. 13 is a block diagram of a second current source 161 according to a comparative example.

The second current source 161 of FIG. 13 is a general current source that converts a voltage generated by a bandgap reference circuit (BGR circuit) 162 to an output current by a voltage-current conversion circuit 163.

The BGR circuit 162 has a first transistor 171, a second transistor 172, a first resistance element 173, a second resistance element 174, a third resistance element 175, and a first operational amplifier 176.

The drain electrode and gate electrode of the first transistor 171 and the drain electrode and gate electrode of the second transistor 172 are connected to the ground.

The source electrode of the first transistor 171 is connected to one end of the first resistance element 173.

Hereinafter, this node will be referred to as the first node.

The source electrode of the second transistor 172 is connected to one end of the second resistance element 174. The other end of the second resistance element 174 is connected to one end of the third resistance element 175.

Hereinafter, this node will be referred to as the second node.

The first node and the second node are connected to the first operational amplifier 176.

The output of the first operational amplifier 176 is connected to the other end of the first resistance element 173 and the other end of the third resistance element 175.

In the BGR circuit 162, the first resistance element 173 generates a voltage by a current flowing through the first resistance element 173 and the first transistor 171 on the basis of the output voltage of the first operational amplifier 176.

The third resistance element 175 generates a voltage by a current flowing through the third resistance element 175, the second resistance element 174, and the second transistor 172 on the basis of the output voltage of the first operational amplifier 176.

As a result, the first operational amplifier 176 of the BGR circuit 162 outputs the voltage dependent on the potential difference between the voltage drop across the first resistance element 173 and the voltage drop across the third resistance element 175, on the basis of its output voltage.

Thereby, the BGR circuit 162 outputs a stable reference voltage.

The voltage-current conversion circuit 163 has a second operational amplifier 181, an output transistor 182, a third transistor 183, and a fourth resistance element 184.

One end of the fourth resistance element 184 is connected to the ground.

The other end of the fourth resistance element 184 is connected to the source electrode of the third transistor 183.

The drain electrode of the third transistor 183 is connected to the power supply of the higher voltage side.

The second operational amplifier 181 is connected to the BGR circuit 162 and the other end of the fourth resistance element 184.

The output of the second operational amplifier 181 is connected to the gate electrode of the third transistor 183.

Due to this configuration, the second operational amplifier 181 operates under the reference voltage of the BGR circuit 162 in such a way that the voltage generated across the fourth resistance element 184 becomes the reference voltage.

If the voltage generated across the fourth resistance element 184 becomes the reference voltage, the operation of the second operational amplifier 181 is stabilized.

In this stable state, a constant current flows through the fourth resistance element 184.

The source electrode of the output transistor 182 is connected to the power supply of the higher voltage side, and the gate electrode is connected to the output of the second operational amplifier 181.

Due to this configuration, the second current source 161 of FIG. 13 outputs a constant current from the output transistor 182.

The current value of this time is determined by Expression 3 shown below. In Expression 3, Vref denotes the reference voltage, and R denotes the resistance value of the fourth resistance element 184.

$$Iout = \frac{V_{REF}}{R} \quad \text{(Expression 3)}$$

The sensitivity of the output current of the second current source 161 of FIG. 13 to supply voltage variation depends on the constant voltage source by the BGR circuit 162 and the power supply-noise rejection ratio (PSRR) of the second operational amplifier 181.

In many cases, the design can be so made that this sensitivity is low.

Therefore, variation of the output current of the second current source 161 of FIG. 13 is attributed mainly to manufacturing variation of the resistors and the temperature characteristics of the resistors.

As a result, the second current source 161 of FIG. 13 does not enjoy the benefit of process miniaturization but requires a certain circuit mounting area.

Furthermore, the second current source 161 of FIG. 13 always consumes a current.

Therefore, it is difficult to use the second current source 161 of FIG. 13 if there are restrictions on the mounting area or the power consumption.

The second current source 161 of FIG. 13 uses the second operational amplifier 181 and so forth.

Therefore, the second current source 161 of FIG. 13 requires a high voltage as the minimum drive voltage for operation as a current source.

The second current source 161 of FIG. 13 requires a supply voltage higher than that of the constant current sources 1 of the first to fifth embodiments of the present invention, and cannot be driven by a low voltage comparable to the voltage drop across the transistors of two stages.

The above-described respective embodiments are examples of preferred embodiments of the present invention. The present invention is not limited thereto but various modifications or changes may be made without departing from the scope of the present invention.

For example, in the above-described respective embodiments, the output converter 17 connected to the low-pass filter 15 is connected to the connecting node 45 between the second capacitor 43 and the resistance element 44.

As another configuration, for example, the output converter 17 may be connected to the signal line 41 of the low-pass filter 15.

However, if the output converter 17 is connected to the signal line 41 of the low-pass filter 15, a ripple component of the voltage due to the charge/discharge current control of the charge pump 14 is included in this signal line 41.

In contrast, if the output converter 17 is connected to the connecting node 45 between the second capacitor 43 and the resistance element 44, the ripple component of the voltage is effectively suppressed by the low-pass filter 15 based on the second capacitor 43 and the resistance element 44.

As a result, the output current of the constant current source 1 is further stabilized.

In the above-described respective embodiments, the frequency divider 12 is connected between the current control oscillator 11 and the comparator 13.

As another configuration, for example, the current control oscillator 11 is connected directly to the comparator 13. In this case, the comparator 13 compares the oscillation signal with the reference clock signal.

In the above-described sixth embodiment, the current source of the embodiment of the present invention is applied to the transmission IC 102 of the signal transmission device 101.

As another configuration, for example, the current source of the embodiment of the present invention may be applied to the reception IC 103 of the signal transmission device 101.

The current source of the embodiment of the present invention may be applied to an integrated circuit other than the transmission IC 102 and the reception IC 103.

Furthermore, the current source of the embodiment of the present invention may be applied to, besides the signal transmission device, electronic apparatus such as a transmitter in a signal transmission system, a receiver in a signal transmission system, a signal processing device, and a display device.

The present application contains subject matter related to that disclosed in Japanese Priority Patent Application JP 2009-230295 filed with the Japan Patent Office on Oct. 2, 2009, the entire content of which is hereby incorporated by reference.

What is claimed is:

1. A current source, comprising:
a current control oscillator configured to output an oscillation signal of a frequency dependent on an input current;
a comparator configured to compare the oscillation signal with a reference signal;
a charge pump configured to output a current dependent on a comparison result by the comparator;
a low-pass filter configured to include a smoothing capacitor charged and discharged by an output current of the charge pump;
a loop converter configured to be connected to the smoothing capacitor and generate a current dependent on a voltage generated by the smoothing capacitor to supply the current as the input current to the current control oscillator;
an output converter configured to be connected to the low-pass filter and generate a current dependent on a voltage generated in the low-pass filter to output the current as an output current; and
a plurality of the output converters;
a plurality of switches;
an output terminal that outputs a current of the current source; and
a controller; wherein
the plurality of switches are connected to the output terminal,
each of the plurality of switches is connected to a respective one of the plurality of the output converters,
the plurality of the output converters are connected to the low-pass filter, and
the controller is connected to the plurality of switches, and switches a current output from the output terminal by controlling opening and closing of the plurality of switches.

2. The current source according to claim 1, wherein
a circuit composed of a capacitor and a resistance element connected in series is connected in parallel to the smoothing capacitor in the low-pass filter, and
the output converter is connected to a connecting node between the capacitor and the resistance element.

3. The current source according to claim 1, further comprising
a current combiner configured to be connected to the output converter, the output current of the output converter and an auxiliary current being input to the current combiner, wherein
the current combiner combines the output current and the auxiliary current and outputs a resulting current.

4. The current source according to claim 1, further comprising
an internal-use converter configured to be connected to the low-pass filter in parallel to the output converter and generate a current dependent on the voltage generated in the low-pass filter, wherein the current of the internal-use converter and the current of the loop converter are supplied as the input current to the current control oscillator.

5. The current source according to claim 1, wherein
the output converter includes an output transistor having a control electrode, a first electrode, and a second electrode,
the control electrode is connected to the low-pass filter in the output transistor, and
the output current dependent on voltage of the control electrode flows from the first electrode to the second electrode in the output transistor.

6. A current source, comprising:
a current control oscillator configured to output an oscillation signal of a frequency dependent on an input current;
a comparator configured to compare the oscillation signal with a reference signal;
a charge pump configured to output a current dependent on a comparison result by the comparator;
a low-pass filter configured to include a smoothing capacitor charged and discharged by an output current of the charge pump;
a loop converter configured to be connected to the smoothing capacitor and generate a current dependent on a voltage generated by the smoothing capacitor to supply the current as the input current to the current control oscillator;
an output converter configured to be connected to the low-pass filter and generate a current dependent on a voltage generated in the low-pass filter to output the current as an output current; and
an internal-use converter configured to be connected to the low-pass filter in parallel to the output converter and generate a current dependent on the voltage generated in the low-pass filter, wherein
the current of the internal-use converter and the current of the loop converter are supplied as the input current to the current control oscillator,
the current source is formed in an integrated circuit,
the internal-use converter includes
  a current supply unit that operates by supply of power to the integrated circuit and outputs a current,
  a first current mirror circuit that folds back and outputs a current from the current supply unit,
  a voltage-current conversion circuit that is connected to the low-pass filter in parallel to the output converter and generates a current dependent on the voltage generated in the low-pass filter, and
  a second current mirror circuit that folds back and outputs a current from the voltage-current conversion circuit, and
an output of the first current mirror circuit is connected to an output of the second current mirror circuit, and a current as the sum of an output current of the first current mirror circuit and an output current of the second current mirror circuit is generated.

7. The current source according to claim 6, wherein
the internal-use converter includes an adjustment transistor including a control electrode, a first electrode, and a second electrode,
the control electrode is connected to the second current mirror circuit in the adjustment transistor,
the second electrode is connected to the current supply unit in the adjustment transistor,
the adjustment transistor draws a current of the same value as a value of a current supplied from the voltage-current conversion circuit to the second current mirror circuit from a current supplied from the current supply unit to the first current mirror circuit, and
the adjustment transistor changes a generated current from a first current to a second current.

8. An electronic apparatus, comprising:
a current source that outputs a current; and
an input-subject unit to which an output current of the current source is input;
the current source including
  a current control oscillator configured to output an oscillation signal of a frequency dependent on an input current,
  a comparator configured to compare the oscillation signal with a reference signal,
  a charge pump configured to output a current dependent on a comparison result by the comparator,
  a low-pass filter configured to include a smoothing capacitor charged and discharged by an output current of the charge pump,
  a loop converter configured to be connected to the low-pass filter and generate a current dependent on a voltage output by the low-pass filter to supply the current as the input current to the current control oscillator,
  an output converter configured to be connected to the low-pass filter and generate a current dependent on a voltage generated in the low-pass filter to output the current as an output current,
  a plurality of the output converters,
  a plurality of switches,
  an output terminal that outputs a current of the current source, and
  a controller; wherein
  the plurality of switches are connected to the output terminal,
  each of the plurality of switches is connected to a respective one of the plurality of the output converters,
  the plurality of the output converters are connected to the low-pass filter, and
  the controller is connected to the plurality of switches, and switches a current output from the output terminal by controlling opening and closing of the plurality of switches.

9. The electronic apparatus according to claim 8, wherein the current source further comprises:
a circuit composed of a capacitor and a resistance element connected in series is connected in parallel to the smoothing capacitor in the low-pass filter, and
the output converter is connected to a connecting node between the capacitor and the resistance element.

10. The electronic apparatus according to claim 8, wherein the current source further comprises:
a current combiner configured to be connected to the output converter, the output current of the output converter and an auxiliary current being input to the current combiner, wherein
the current combiner combines the output current and the auxiliary current and outputs a resulting current.

11. The electronic apparatus according to claim 8, wherein the current source further comprises:
an internal-use converter configured to be connected to the low-pass filter in parallel to the output converter and generate a current dependent on the voltage generated in the low-pass filter, wherein
the current of the internal-use converter and the current of the loop converter are supplied as the input current to the current control oscillator.

12. The electronic apparatus according to claim 8, wherein the current source further comprises:
- the output converter includes an output transistor having a control electrode, a first electrode, and a second electrode,
- the control electrode is connected to the low-pass filter in the output transistor, and
- the output current dependent on voltage of the control electrode flows from the first electrode to the second electrode in the output transistor.

13. An integrated circuit, comprising
a current source,
the current source including:
- a current control oscillator configured to output an oscillation signal of a frequency dependent on an input current;
- a comparator configured to compare the oscillation signal with a reference signal;
- a charge pump configured to output a current dependent on a comparison result by the comparator;
- a low-pass filter configured to include a smoothing capacitor charged and discharged by an output current of the charge pump;
- a loop converter configured to be connected to the low-pass filter and generate a current dependent on a voltage output by the low-pass filter to supply the current as the input current to the current control oscillator;
- an output converter configured to be connected to the low-pass filter and generate a current dependent on a voltage generated in the low-pass filter to output the current as an output current;
- a plurality of the output converters;
- a plurality of switches;
- an output terminal that outputs a current of the current source; and
- a controller, wherein
- the plurality of switches are connected to the output terminal,
- each of the plurality of switches is connected to a respective one of the plurality of the output converters,
- the plurality of the output converters are connected to the low-pass filter, and
- the controller is connected to the plurality of switches, and switches a current output from the output terminal by controlling opening and closing of the plurality of switches.

14. The integrate circuit according to claim 13, wherein the current source further comprises:
- a circuit composed of a capacitor and a resistance element connected in series is connected in parallel to the smoothing capacitor in the low-pass filter, and
- the output converter is connected to a connecting node between the capacitor and the resistance element.

15. The integrated circuit according to claim 13, wherein the current source further comprises:
- a current combiner configured to be connected to the output converter, the output current of the output converter and an auxiliary current being input to the current combiner, wherein
- the current combiner combines the output current and the auxiliary current and outputs a resulting current.

16. The integrated circuit according to claim 13, wherein the current source further comprises:
- an internal-use converter configured to be connected to the low-pass filter in parallel to the output converter and generate a current dependent on the voltage generated in the low-pass filter, wherein
- the current of the internal-use converter and the current of the loop converter are supplied as the input current to the current control oscillator.

17. The integrated circuit according to claim 13, wherein the current source further comprises:
- the output converter includes an output transistor having a control electrode, a first electrode, and a second electrode,
- the control electrode is connected to the low-pass filter in the output transistor, and
- the output current dependent on voltage of the control electrode flows from the first electrode to the second electrode in the output transistor.

* * * * *